(12) United States Patent
Lee et al.

(10) Patent No.: US 9,859,936 B2
(45) Date of Patent: Jan. 2, 2018

(54) ELECTRONIC DEVICE

(71) Applicant: Samsung Electronics Co., Ltd., Suwon-si, Gyeonggi-do (KR)

(72) Inventors: John-Gy Lee, Suwon-si (KR); Yong-Sang Yun, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/170,073

(22) Filed: Jun. 1, 2016

(65) Prior Publication Data

US 2016/0360632 A1 Dec. 8, 2016

(30) Foreign Application Priority Data

Jun. 2, 2015 (KR) .................. 10-2015-0078217

(51) Int. Cl.
*H04B 1/3818* (2015.01)
*H05K 1/18* (2006.01)
*H04M 1/02* (2006.01)
*G06F 1/16* (2006.01)
*G06K 19/077* (2006.01)

(52) U.S. Cl.
CPC ............. *H04B 1/3818* (2015.01); *G06F 1/16* (2013.01); *G06K 19/077* (2013.01); *H04M 1/026* (2013.01); *H05K 1/18* (2013.01); *H05K 2201/10151* (2013.01); *H05K 2201/10325* (2013.01)

(58) Field of Classification Search
CPC ...... H05K 5/0295; H05K 5/0017; H05K 1/18; H05K 5/0217; H05K 2201/10151; H05K 2201/1032; H05K 2201/10325; H04M 1/026; H04M 2250/14; H04B 1/3818; G06F 1/185; G06F 1/186; G06F 1/18
USPC .................. 361/679.31–679.39, 724–727
See application file for complete search history.

(56) References Cited

U.S. PATENT DOCUMENTS

| | | | |
|---|---|---|---|
| 8,462,514 B2 | 6/2013 | Myers et al. | |
| 9,374,118 B2 * | 6/2016 | Zheng | H04B 1/3816 |
| 2008/0165508 A1 | 7/2008 | Wang et al. | |
| 2009/0171513 A1 * | 7/2009 | Tsukazawa | G06F 1/203 |
| | | | 700/300 |
| 2010/0323757 A1 * | 12/2010 | Seflic | H04M 1/72522 |
| | | | 455/557 |
| 2012/0196462 A1 * | 8/2012 | Henry | G06F 1/1656 |
| | | | 439/159 |
| 2012/0276764 A1 * | 11/2012 | Nakase | G06K 13/0831 |
| | | | 439/159 |
| 2013/0115796 A1 * | 5/2013 | Liu | G06K 7/0021 |
| | | | 439/325 |
| 2014/0092571 A1 * | 4/2014 | Trzaskos | G06K 13/0806 |
| | | | 361/754 |
| 2014/0101466 A1 * | 4/2014 | Itakura | G06K 13/0806 |
| | | | 713/300 |
| 2014/0240910 A1 | 8/2014 | Yoon et al. | |

(Continued)

*Primary Examiner* — Steven T Sawyer
*Assistant Examiner* — Sagar Shrestha
(74) *Attorney, Agent, or Firm* — Jefferson IP Law, LLP

(57) ABSTRACT

An electronic device is provided. The electronic device includes a housing, a sensor disposed inside the housing, a tray for receiving a storage medium, the tray being detachably coupled to the inside of the housing, and a shared hole for providing a path for operating the tray to be discharged to the outside of the housing and for connecting the sensor to the outside of the housing.

17 Claims, 11 Drawing Sheets

(56) References Cited

U.S. PATENT DOCUMENTS

| | | | | |
|---|---|---|---|---|
| 2014/0363995 | A1* | 12/2014 | Shimada | G06K 13/085 439/327 |
| 2014/0377976 | A1* | 12/2014 | Tsai | G06K 7/0069 439/345 |
| 2015/0303963 | A1* | 10/2015 | Zheng | H04B 1/3816 455/558 |
| 2016/0073529 | A1* | 3/2016 | Kole | H04B 1/3816 74/100.1 |
| 2016/0380385 | A1* | 12/2016 | Heiskanen | H01R 13/6335 439/160 |

\* cited by examiner

ELECTRONIC DEVICE

CROSS-REFERENCE TO RELATED APPLICATION(S)

This application claims the benefit under 35 U.S.C. §119(a) of a Korean patent application filed on Jun. 2, 2015 in the Korean Intellectual Property Office and assigned Serial number 10-2015-0078217, the entire disclosure of which is hereby incorporated by reference.

TECHNICAL FIELD

The present disclosure relates to an electronic device. More particularly, the present disclosure relates to an electronic device including a releasable storage medium.

BACKGROUND

Electronic devices can output stored information in sound, video, or combinations thereof. With an increase in a degree of technology integration of the electronic devices and the popularization of hyper-speed and high capacity wireless communication, a typical single mobile communication terminal has various functions mounted thereto. For example, an entertainment function for games, a multimedia function for reproduction of music files and video files, a communication and security function for mobile banking or the like, a scheduling function, an electronic wallet function, and so forth, in addition to a communication function, are often integrated into one singular electronic device. Further, such an integrated device may be provided as a portable electronic device, for example, an electronic diary, portable multimedia player, mobile communication terminal, tablet personal computer (PC), and the like, which generally has a display device and a battery mounted thereto, and has a bar-type, folder-type, or slide-type external appearance.

Further, such an integrated device may be provided as an electronic device having a case or a case part (e.g., edge of the case) made of metal, and having a battery that is not detachable therefrom but integrally fixed therein.

In such electronic devices, a security function such as user authentication or a storage capacity can be expanded using for example, a subscriber identification module (SIM) card or a storage medium such as a memory card. A socket is installed in the electronic device so that a tray receiving the storage medium can be slidably mounted to the socket. Further, the electronic device has a hole or other opening for receiving and discharging the tray from the electronic device.

Such an electronic device may also have holes for detecting environmental factors such as sounds and gasses from the outside of the device, as well as holes or other openings for receiving and discharging the tray described above. Such holes have negative effects on both the function and aesthetic appearance of the electronic device. For example, foreign substances such as dust and water may be introduced into the electronic device from the outside through the holes and thus, a dustproof/waterproof structure for each of the holes may be needed.

The above information is presented as background information only, and to assist with an understanding of the present disclosure. No determination has been made, and no assertion is made, as to whether any of the above might be applicable as prior art with regard to the present disclosure.

SUMMARY

Aspects of the present disclosure are provided to address at least the above-mentioned problems and/or disadvantages, and to provide at least the advantages described below. Accordingly, an aspect of the present disclosure is to provide an electronic device having a function and aesthetic appearance that is improved by reducing a plurality of holes formed in the electronic device.

Another aspect of the present disclosure is to provide an electronic device having a reduced number of holes formed therein, which can prevent foreign substances from being introduced into the electronic device.

In accordance with an aspect of the present disclosure, an electronic device is provided. The electronic device includes a housing, a sensor arranged inside the housing, a tray for receiving a storage medium, the tray being detachably coupled to an inside of the housing, and a hole formed in at least one of the housing and the tray for providing a path for operating the tray to be discharged from the housing and connect the sensor to the outside of the housing.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, like reference numerals will be understood to refer to like parts, components, and structures.

DETAILED DESCRIPTION

Figure 1:
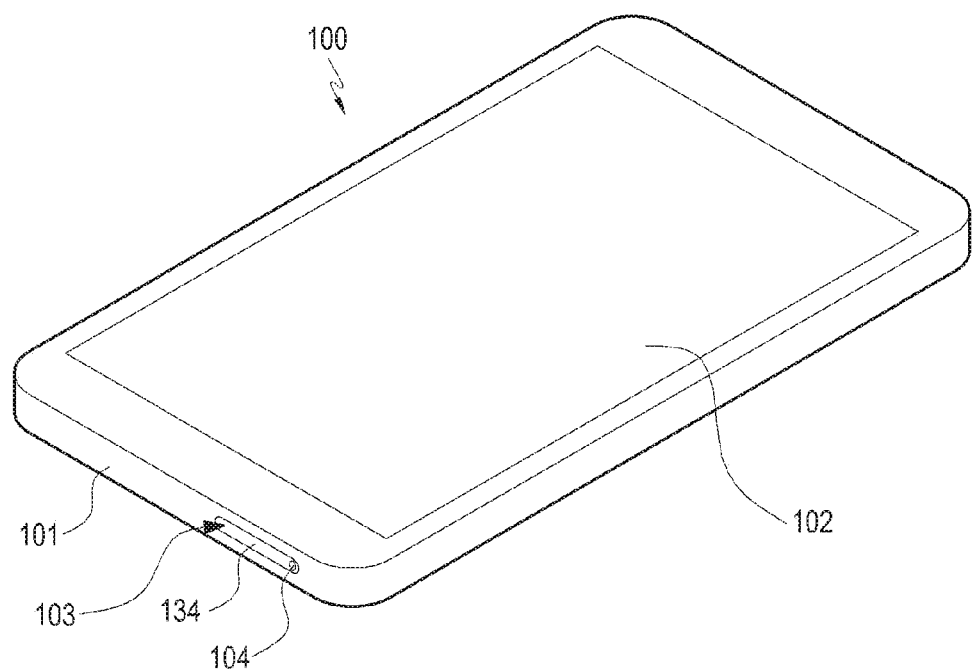
FIG. 1 is a perspective view illustrating a state in which a tray of an electronic device is mounted to a housing according to various embodiments of the present disclosure.

The following description with reference to the accompanying drawings is provided to assist in a comprehensive understanding of various embodiments of the present disclosure as defined by the claims and their equivalents. It includes various specific details to assist in that understanding, but these are to be regarded as merely exemplary. Accordingly, those of ordinary skill in the art will recognize that various changes and modifications of the various embodiments described herein can be made without departing from the spirit and scope of the present disclosure. In addition, descriptions of well-known functions and constructions may be omitted for clarity and conciseness.

The terms and words used in the following description and claims are not limited to the bibliographical meanings, but are merely used to enable a clear and consistent understanding of the present disclosure. Accordingly, it should be apparent to those skilled in the art that the following description of various embodiments of the present disclosure is provided for illustration purpose only, and not for the purpose of limiting the present disclosure as defined by the appended claims and their equivalents.

It is to be understood that the singular forms "a", "an", and "the", include plural referents unless the context clearly dictates otherwise. Thus, for example, reference to "a component surface" includes reference to one or more of such surfaces.

In the present disclosure, the expression "have", "may have", "include" or "may include" refers to the existence of a corresponding feature (e.g., numerical value, function, operation, or components such as elements), and does not exclude the existence of additional or different features.

In the present disclosure, the expression "A or B", "at least one of A or/and B", or "one or more of A or/and B" may include all possible combinations of the items listed. For example, the expression "A or B", "at least one of A and B", or "at least one of A or B" refers to all of (1) including at least one A, (2) including at least one B, or (3) including all of at least one A and at least one B.

The expression "a first", "a second", "the first", or "the second" used in various embodiments of the present disclosure may modify various components regardless of the order and/or the importance, but does not limit the corresponding components. For example, a first user device and a second user device indicate different user devices although both of them are user devices. As further example, a first element may be termed a second element, and similarly, a second element may be termed a first element without departing from the scope of the present disclosure.

It should be understood that when an element (e.g., first element) is referred to as being (operatively or communicatively) "connected," or "coupled," to another element (e.g., second element), it may be connected or coupled directly to the other element or indirectly to the other element via any number of other elements (e.g., third element) that may be interposed between them. In contrast, it may be understood that when an element (e.g., first element) is referred to as being "directly connected," or "directly coupled" to another element (e.g., second element), there are no elements (e.g., third element) interposed between them.

Unless defined otherwise, all terms used herein, including technical and scientific terms, have the same meaning as those commonly understood by a person skilled in the art to which the present disclosure pertains. Such terms as those defined in a generally used dictionary may be interpreted to have meanings equal to the contextual meanings in the relevant field of art, and are not to be interpreted to have ideal or excessively formal meanings unless clearly defined as such in the present disclosure. In some cases, even the terms defined in the present disclosure should not be interpreted to exclude embodiments of the present disclosure.

In the present disclosure, an electronic device may be a random device, and the electronic device may be called a terminal, portable terminal, mobile terminal, communication terminal, portable communication terminal, portable mobile terminal, display device, or the like.

For example, the electronic device may be a smartphone, portable phone, game player, television (TV), display unit, heads-up display unit for a vehicle, notebook computer, laptop computer, tablet personal computer (PC), personal media player (PMP), personal digital assistant (PDA), and the like. The electronic device may also be implemented as a portable communication terminal which has a wireless communication function and a pocket size. Further, the electronic device may be a flexible device, flexible display device and/or impact-resistant display device.

The electronic device may also communicate with an external electronic device, such as a server or the like, or perform operations through an interworking with external electronic devices. For example, the electronic device may transmit an image photographed by a camera and/or position information detected by a sensor unit to a server through a network. The network may be a mobile or cellular communication network, local area network (LAN), wireless LAN (WLAN), wide area network (WAN), Internet, small area network (SAN) or the like, but is not limited thereto.

FIG. 1 is a perspective view illustrating a state in which a tray of an electronic device is mounted to a housing according to various embodiments of the present disclosure.

Figure 2:
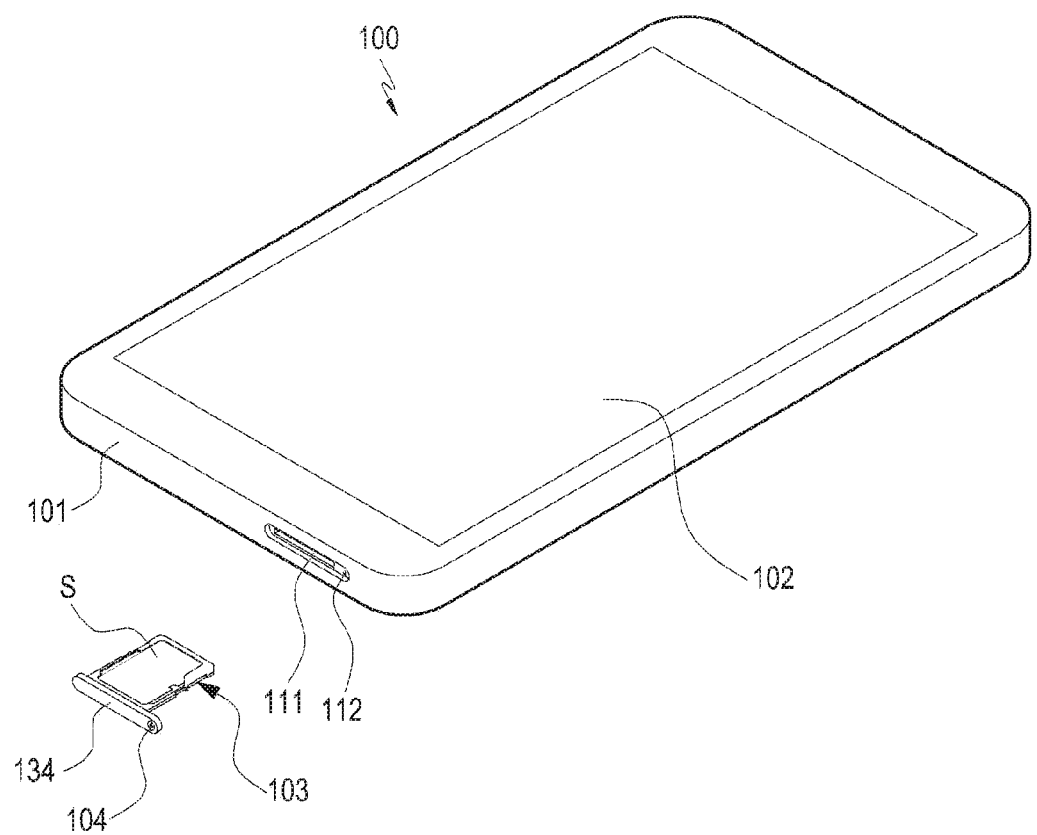
FIG. 2 is a perspective view illustrating a state in which a tray of an electronic device is separated from a housing according to various embodiments of the present disclosure.

FIG. 2 is a perspective view illustrating a state in which a tray of an electronic device is separated from a housing according to various embodiments of the present disclosure.

As noted above, a security function such as user authentication or a storage capacity can be expanded for an electronic device by using for example, a subscriber identification module (SIM) card or a storage medium such as a memory card. A socket is installed in the electronic device so that a tray receiving the storage medium can be slidably mounted to the socket. A hole or other opening can be provided for receiving and discharging the tray from the electronic device.

Referring to FIGS. 1 and 2, an electronic device 100 according to various embodiments of the present disclosure may include a housing 101, a display device 102, a tray 103, and holes 104 and 112.

The electronic device 100 may include various input/output devices such as a keypad and a receiver, various sensors such as a proximity-illuminance sensor, and a camera, which are mounted thereto. Additional details of the various input/output devices, various sensors, and camera, are omitted.

The housing 101 can form an outer shape of the electronic device 100 while protecting the interior of the electronic device 100. The housing 101 may be made of a plastic material, e.g., a polycarbonate material. However, the housing 101 is not limited to the polycarbonate material, and may be made of various plastic materials. Further, the housing 101 may be made of a resin, metal, and/or metal powder material. For example, a part of the housing, e.g., an edge of the housing, may be made of a metal material while the other parts of the case or housing may be made of resin. Further, the housing 101 made of a metal material or parts of the housing 101 made of a metal material may be utilized as an antenna radiator of the electronic device 100. A circuit board is provided inside the housing 101, and may include a controller, a communication circuit unit, and the like, mounted thereon, which are provided for operating the electronic device 100 and can function as a main circuit board.

The display device 102 may include a window member and a touch panel, and may be formed on a front surface of the housing 101. The window member can allow a screen output through the display device 102 to pass while protecting the interior of the display device 102. Further, the window member may be integrally formed with the touch panel and can function as an input device.

The tray 103 can receive a storage medium S and be detachably coupled from the outside of the housing 101 to the interior of the housing 101. The tray 103 may have an outer surface 134 which can be gripped by a hand of a user or a tool as described in greater detail below. In a state in which the tray 103 is received in the interior of the housing 101, the outer surface 134 of the tray 103 may be located on the same plane as that of the outer surface of the housing 101, and the outer surface 134 together with the housing 101 can constitute the outer shape of the electronic device 100. Further, a first hole 104 for withdrawing the tray 103 as described in greater detail below can be formed in the outer surface 134 of the tray 103.

The tray 103 is not limited to embodiments that are detachably coupled to an upper surface or a lower surface extending from the front surface of the housing 101 in an up/down direction, but can also include embodiments that are detachably coupled to a side surface extending from the front surface of the housing 101 in a left/right direction.

Referring to FIG. 2, the housing 101 may include an opening 111 for allowing the tray 103 and the outer surface 134 of the tray 103 to be slidably received. For example, the tray 103 can be mounted to the housing 101 through the opening 111 to the point where the outer surface 134 of the tray 103 is located on the same plane as that of the outer surface of the housing 101.

Further, as described above, the tray 103 can receive the storage medium S. The storage medium S may include a memory card such as a secure digital (SD) card or micro SD card, or a subscriber identification module (SIM) card, but embodiments are not limited thereto. In an embodiment, the tray 103 may be integrally formed with a memory or memory card. The tray 103 may be made of a plastic material, e.g., a polycarbonate material. However, the tray 103 is not limited to the polycarbonate material, and may be made of various plastic materials. Further, the tray 103 may be made of a resin, metal, and/or metal powder material. For example, the tray 103 may be at least partially made of a metal material, thereby implementing a design which is harmonious with the housing 101 when made of a similar metal material.

Figure 3:
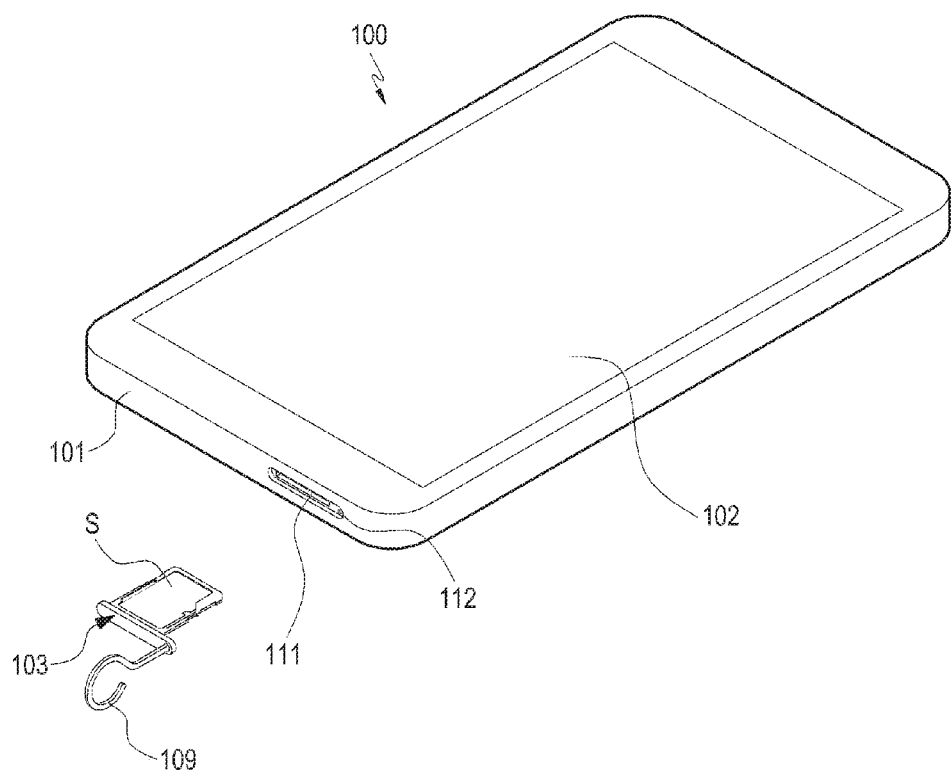
FIG. 3 is a perspective view illustrating a tray and a rod of an electronic device according to various embodiments of the present disclosure.

FIG. 3 is a perspective view illustrating a tray and a rod of an electronic device according to various embodiments of the present disclosure.

Referring to FIGS. 2 and 3, holes that permit removal of the tray 103 may include the first hole 104 formed on the outer surface 134 of the tray 103, and the second hole 112 formed in the housing 101.

According to various embodiments, the second hole 112 can be configured to correspond to and align with the first hole 104 in a state in which the tray 103 is received in the interior of the housing 101. A rod 109 or similar tool can be inserted into the first hole 104 in order to discharge the tray 103 as described in greater detail below. When the tray 103 is mounted to the housing 101 through the opening 111, if the rod 109 is inserted into the second hole 112 through the first hole 104, the tray 103 is extended and separated from the housing 101 to be exposed to the outside of the housing 101.

Figure 4:
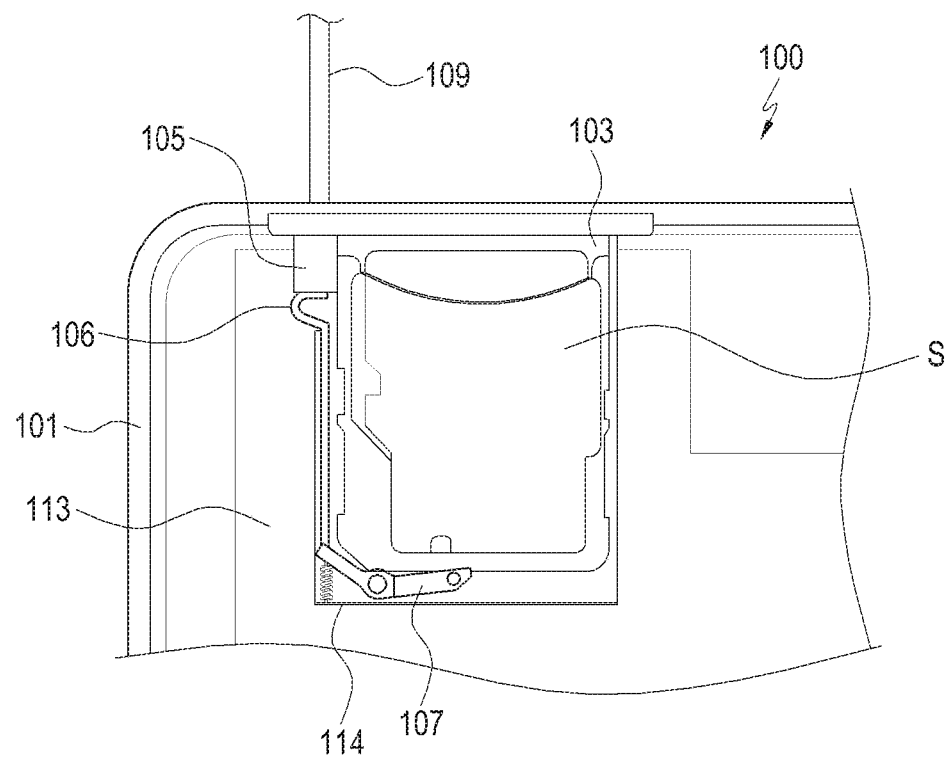
FIG. 4 is a partial sectional view illustrating a state in which a tray of an electronic device is mounted to a housing according to various embodiments of the present disclosure.

FIG. 4 is a partial sectional view illustrating a state in which a tray of an electronic device is mounted to a housing according to various embodiments of the present disclosure.

Referring to FIG. 4, an electronic device 100 according to various embodiments of the present disclosure may include a circuit board 113, a socket 114, a sensor connection part 105, a push bar 106, and a lever 107.

The circuit board 113 is mounted to the inside of the housing 101, and may include an integrated circuit chip such as an application processor (AP), communication module, memory, audio module and power management module, and electronic components such as various sensors, antenna units, and connectors, such as a connector for connecting an external device.

The socket 114 can be mounted on one surface of the circuit board 113 to slidably receive the tray 103. Once the tray 103 is received in the socket 114, the socket 114 can be connected to the storage medium S.

The sensor connection part 105 is mounted on one surface of the circuit board 113 alongside the socket 114, and can provide a passage through which the rod 109 is moved to engage the push bar 106. However, the sensor connection part 105 is not limited to being mounted on the circuit board 113 as a separate element, and may be manufactured integrally with the housing 101.

A structure and operation principle to remove the tray 103 that is detachably coupled to the housing 101 will now be described in greater detail.

In a state in which the tray 103 is received in the socket 114, the rod 109 can be inserted through the holes 104 and 112, and then pass through the sensor connection part 105 to engage a first end of the push bar 106. The first end of the push bar 106 can be contoured or curved to block one end of holes until engaged by the rod 109. The push bar 106 can receive a force from the rod 109 and transmit the force to a first end of a rotatable lever 107 to discharge the tray 103 mounted to the socket 114 to the outside of the housing 101. The rod 109 having passed through the holes 104 and 112, can push the push bar 106 in a direction in which the tray 103 is inserted.

When receiving the force from the push bar 106, the lever 107 rotates and a second end of the lever 107 pushes the tray 103 mounted to the socket 114 toward the outside of the housing 101 so that the tray 103 can be extended and separated from the socket 114 so as to be exposed to the outside of the housing 101. The lever 107 is pivotally mounted within the socket 114, and includes the first end to contact the push bar 106 and the second end to contact the tray 103. An elastic part such as a spring is provided to urge the first end of the lever 107 into a contact position with the push bar 106, and urge the first end of the push bar 106 to block one end of the holes. As the rod 109 and push bar 106 are pressed into the device, the lever 107 is rotated and the second end of the lever exerts a force on the tray 103 in a direction opposite to the insertion direction of the rod 109 and push bar 106. As the lever 107 is rotated and the second end exerts force on the tray 103, the tray 103 is pushed from the socket 114 to extend partially from the housing 101, thereby allowing easy removal.

The first hole 104 is not limited to being formed on the outer surface 134 of the tray 103, and may be formed in the housing 101 integrally with the second hole 112 to be adjacent to the opening 111 into which the tray 103 is inserted. For example, the holes 104 and 112 may be formed on an area adjacent to the opening 111 as one hole without forming the first hole 104.

Figure 5:
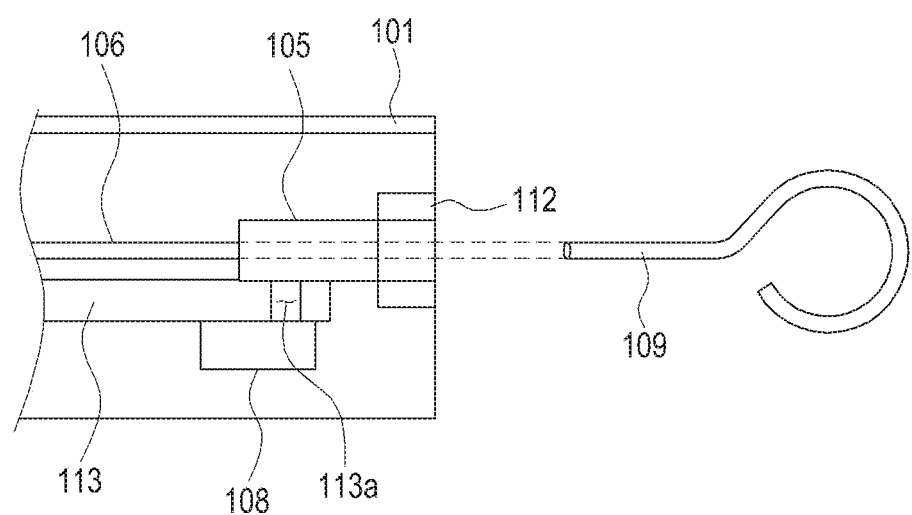
FIG. 5 is a partial sectional view illustrating a state in which a sensor of an electronic device is connected to a shared hole of an electronic device according to various embodiments of the present disclosure.

FIG. 5 is a partial sectional view illustrating a state in which a sensor of an electronic device is connected to a shared hole of an electronic device according to various embodiments of the present disclosure.

Figure 6:
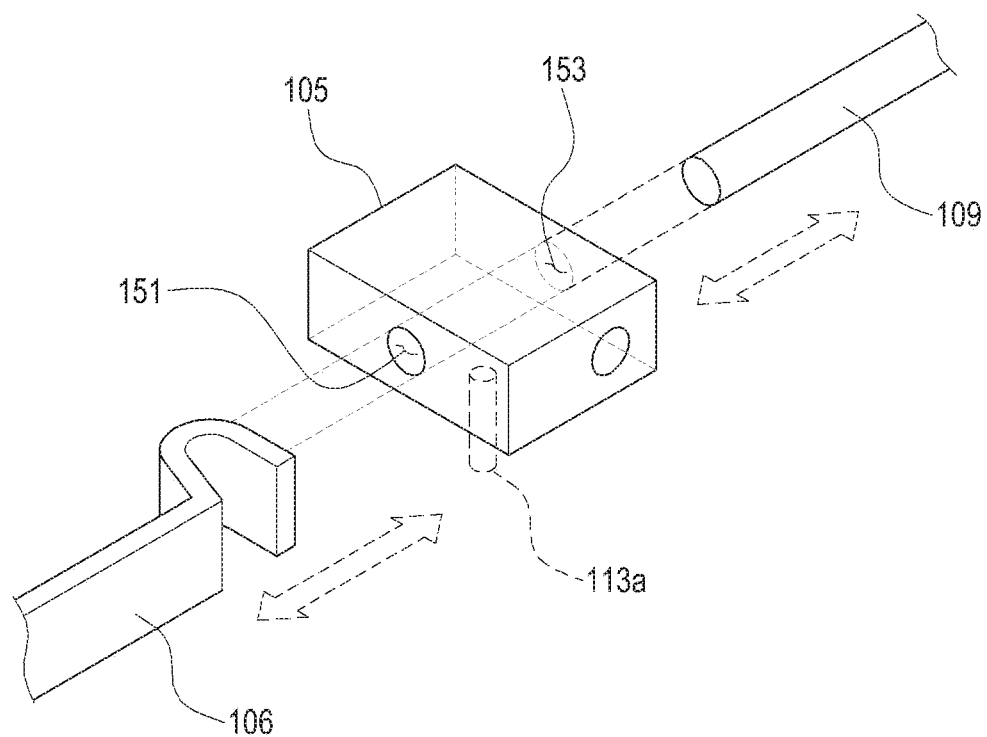
FIG. 6 is a perspective view illustrating a sensor connection part and a push bar of an electronic device according to various embodiments of the present disclosure.

FIG. 6 is a perspective view illustrating a sensor connection part and a push bar of an electronic device according to various embodiments of the present disclosure.

Referring to FIGS. 5 and 6, a sensor 108 of an electronic device according to one of various embodiments of the present disclosure may be arranged on the circuit board 113 in an area adjacent to the sensor connection part 105. For example, the sensor 108 may be mounted on one surface of the circuit board 113 to detect environmental factors such as sounds, temperatures, atmospheric pressure, and gasses of the outside of the housing 101. In this case, the sensor 108 may be a microphone sensor for detecting sounds, a temperature sensor for detecting temperature, an atmospheric sensor for detecting pressure, or a gas sensor for detecting gasses, but embodiments are not limited thereto. In the present embodiment, for the convenience of the description, a case where the sensor 108 is a microphone sensor will be described. In this case, the sensor 108 typically requires an opening to operate. Such an opening may be provided separately or in the case of the present invention, may utilize or share an opening provided for the extraction of the tray 103.

The sensor connection part 105 may be formed between the second hole 112 and the sensor 108. The sensor connection part 105 may have a through-hole 153 corresponding to and aligning with the second hole 112 so as to receive either sound or the rod 109 through the second hole 112. Further, the circuit board 113 may have a sensor hole 113a for connecting the sensor 108 and the through-hole 153 of the sensor connection part 105 to each other. As illustrated in FIG. 5, sound may be transmitted to the sensor 108 by passing through the holes 104 and 112, the sensor connection part 105, and the sensor hole 113a. The rod 109 may also pass through the holes 104 and 112, the sensor connection part 105, and engage the push bar 106 that is blocking one end of the through-hole 153 of the sensor connection part 105.

Referring to FIG. 6, the sensor connection part 105 has a connection hole 151 at one end of the through-hole 153, and the rod 109 can linearly move through the through-hole 153 and the connection hole 151. Further, the sensor connection part 105 may be connected to the sensor hole 113a formed on the circuit board 113 as described above. The rod 109 can transmit a force to the push bar 106 through the through-hole 153 and the connection hole 151, and the push bar 106 can transmit the force to the lever 107. In contrast, when the rod 109 is removed and the tray 103 is mounted to the socket 114, the tray 103 can transmit a force to the lever 107, and the lever 107 can transmit the force to the push bar 106 so that a contoured or curved end of the push bar 106 can close the connection hole 151. Accordingly, in a state in which the tray 103 is mounted to the socket 114, sound introduced through the holes 104 and 112 can be communicated to the sensor 108 through the sensor hole 113a, but is prevented from leaking through the connection hole 151 into the body of the electronic device 100.

In this way, in the electronic device 100 according to various embodiments of the present disclosure, the tray 103 can be attached/detached to/from the housing 101 and sound can be transmitted to the sensor 108 using a single hole passage, so that the number of holes formed in the housing 101 can be reduced, thereby improving the function and aesthetic appearance of the electronic device 100. Further, as the number of holes formed in the housing 101 is reduced, dustproof/waterproof structures for holes can be reduced, so that the electronic device 100 can be further miniaturized.

Figure 7:
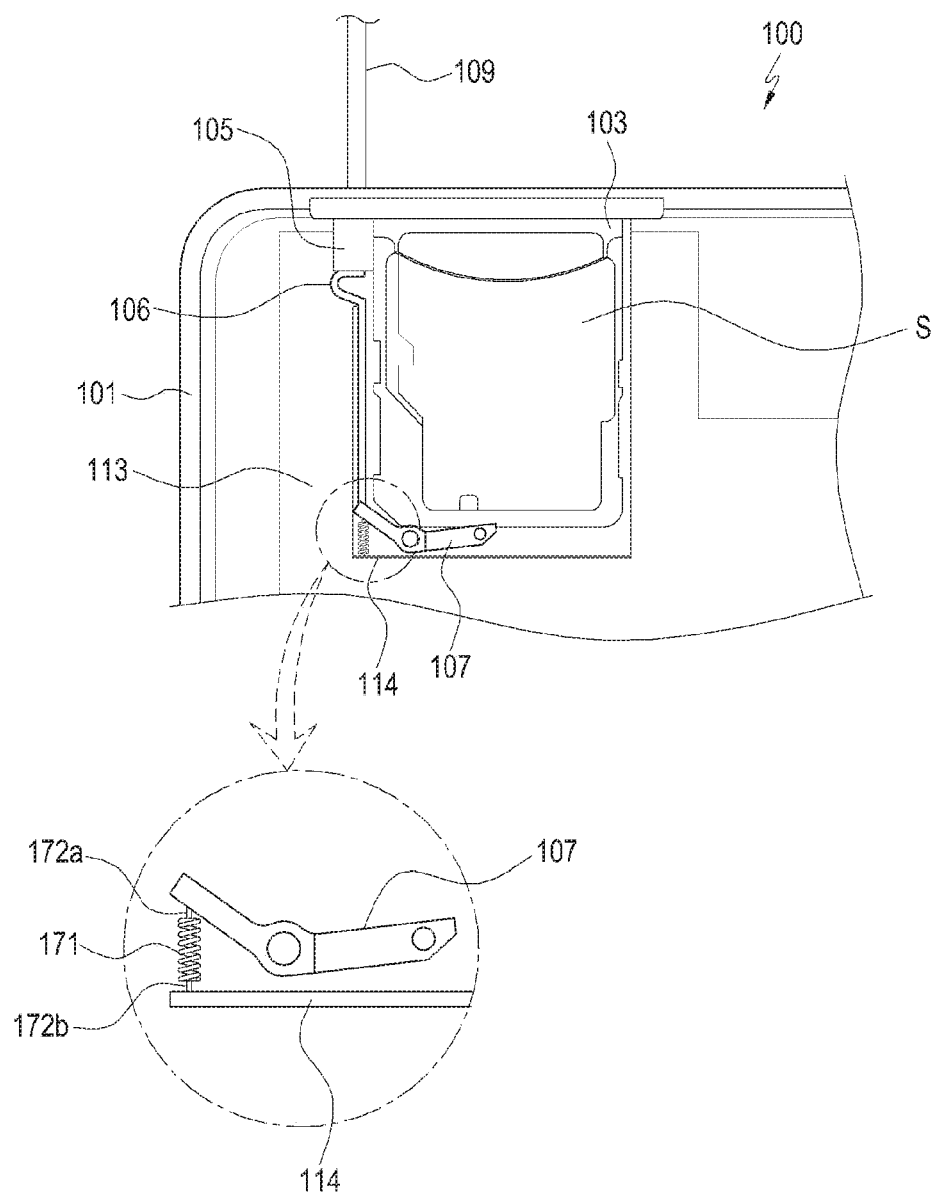
FIG. 7 is a partial sectional view illustrating an elastic part of an electronic device according to various embodiments of the present disclosure.

FIG. 7 is a partial sectional view illustrating an elastic part of an electronic device according to various embodiments of the present disclosure.

Referring to FIG. 7, an electronic device 100 according to various embodiments of the present disclosure may further include elastic parts 171, 172a and 172b for pushing the push bar 106 such that the push bar 106 seals the connection hole 151 when the tray 103 is not mounted to the socket 114.

The elastic parts 171, 172a and 172b may include a first support 172a extending from the lever 107, a second support 172b extending from the socket 114 to the first support 172a, and the elastic part 171 disposed between the first support 172a and the second support 172b. A coil spring is shown as one example of the elastic part 171, but embodiments are not limited thereto.

When the tray 103 pushes the lever 107 while being mounted to the socket 114, the lever 107 can push the push bar 106 in a direction parallel to a direction in which the tray 103 is discharged from the socket 114. At this time, an end of the push bar 106 can block the connection hole 151 as the spring or elastic part 171 provides additional elastic force to the lever 107. When the tray 103 is not mounted to the socket 114, the spring or elastic part 171 provides enough elastic force to the lever 107 to push the push bar 106 in the direction parallel to the direction in which the tray 103 is discharged from the socket 114, and the end of the push bar 106 blocks the connection hole 151.

Further, according to various embodiments of the present disclosure, one end surface of the push bar 106, e.g., a portion where the push bar 106 is in contact with the sensor connection part 105, may be made of rubber or similar material. The sensor connection part 105 can also be made of rubber or similar material. In this case, the surface of the push bar 106 made of rubber and the sensor connection part 105 made of rubber can be pushed into contact with each other by the elastic parts 171, 172a and 172b, blocking the connection hole 151 so as to prevent sound, dust or other contaminants from leaking through the connection hole 151 into the body of the electronic device 100. However, the one surface of the push bar 106 or the sensor connection part 105 is not limited to be made of rubber, and may be made of various materials and various shapes which allow the push bar 106 to seal the connection hole 151.

Figure 8:
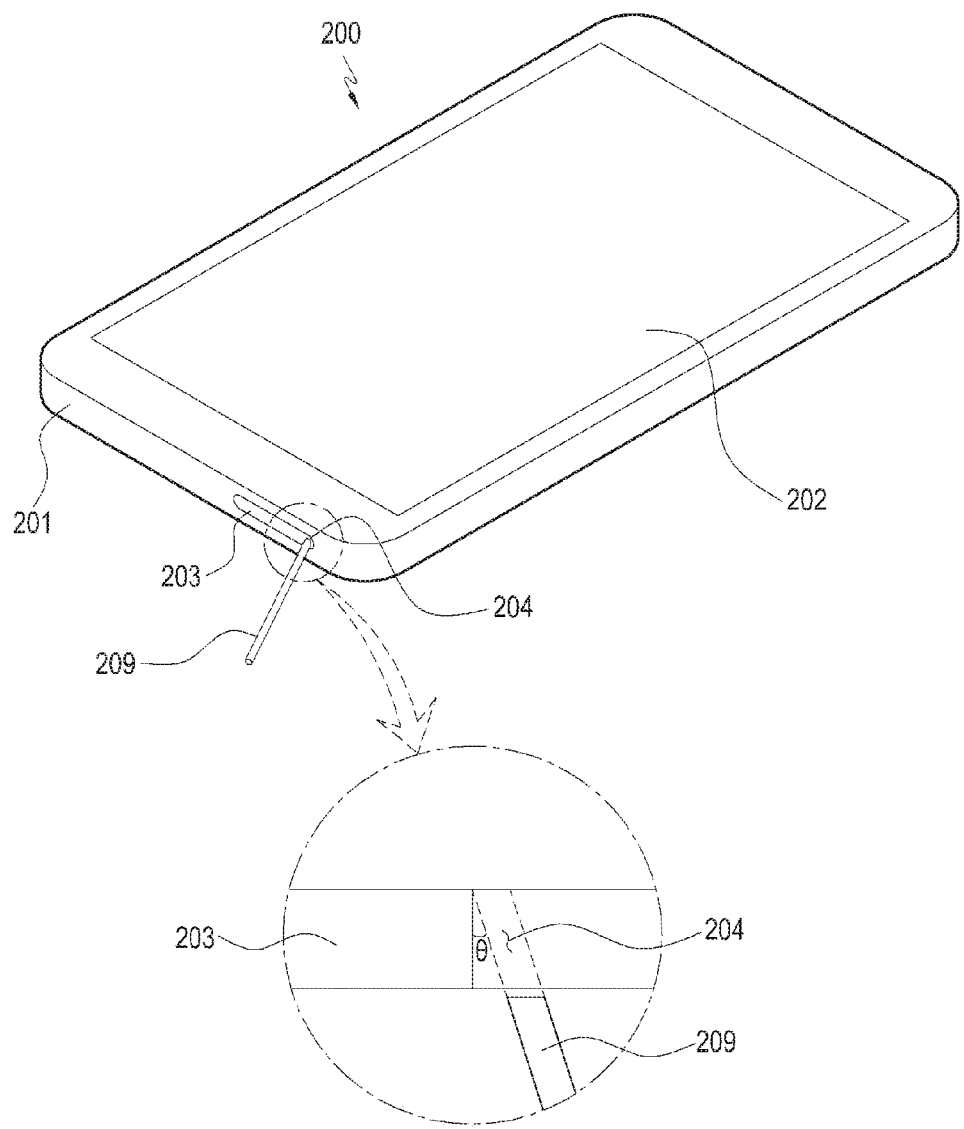
FIG. 8 is a perspective view illustrating a tray and a rod of an electronic device according to various embodiments of the present disclosure.

FIG. 8 is a perspective view illustrating a tray and a rod of an electronic device according to various embodiments of the present disclosure.

Referring to FIG. 8, an electronic device 200 according to various embodiments of the present disclosure may include a housing 201, a display device 202, a tray 203, and a rod 209. In the present embodiment, a detailed description of elements similar to the elements of the above-described embodiments will be omitted, and the remaining description will be directed primarily toward features of the tray 203.

According to an embodiment, the tray 203 may have an inclined or slantingly-formed hole 204 formed therein. The hole 204 can be formed slantingly at a slope $\theta$ with respect to a direction in which the tray 203 is inserted into the housing 201. Such a slantingly-formed hole 204 allows an inserted rod 209 to exert a retraction force against a side of the hole 204 when the rod is inserted in the inclined direction, and then retracted in a non-inclined direction (e.g., a direction in which the tray 203 travels).

In a state in which the rod 209 is inserted into the hole 204, when the rod 209 is used to apply a retraction force in a manner directed to one side surface of the hole 204, the tray 203 may be withdrawn from the housing 201 and exposed to the outside of the housing 201.

Figure 9:
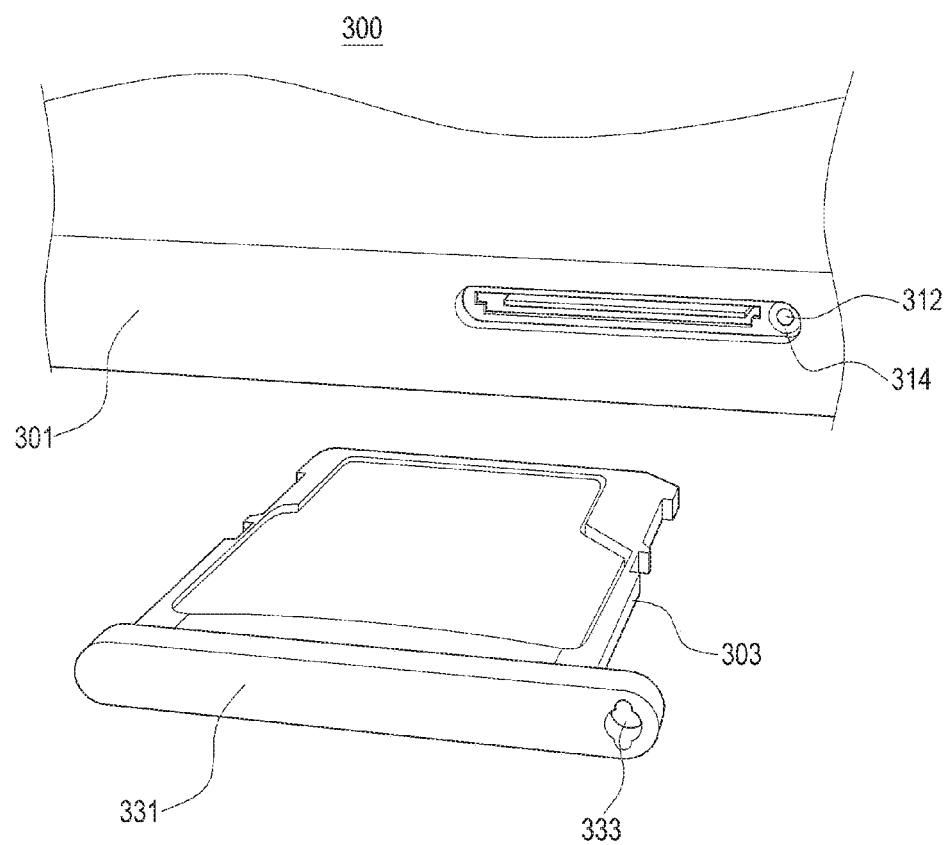
FIG. 9 is a perspective view illustrating a state in which a tray of an electronic device is separated from a housing according to various embodiments of the present disclosure.

FIG. 9 is a partial perspective view illustrating a state in which a tray of an electronic device is separated from a housing according to various embodiments of the present disclosure.

Figure 10:
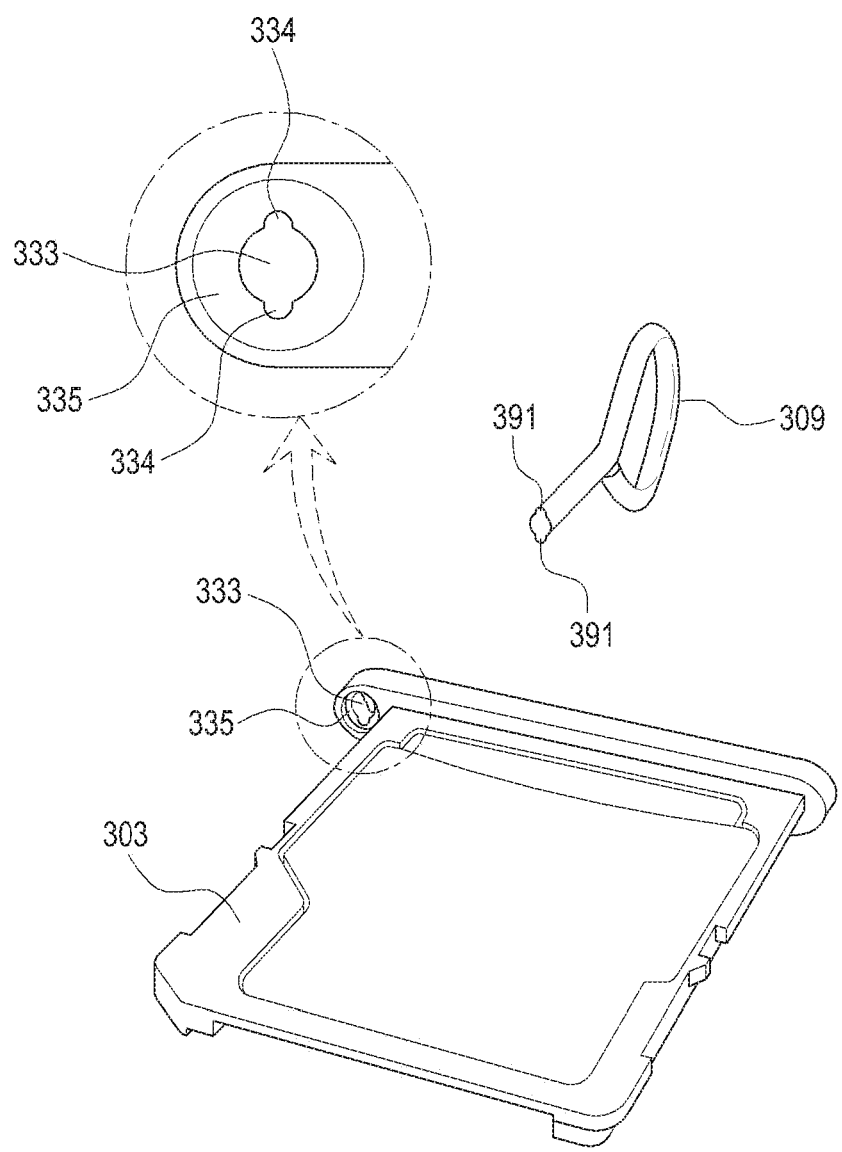
FIG. 10 is a perspective view illustrating a tray and a rod of an electronic device according to various embodiments of the present disclosure.

FIG. 10 is a perspective view illustrating a tray and a rod of an electronic device according to various embodiments of the present disclosure.

Referring to FIGS. 9 and 10, an electronic device 300 according to various embodiments of the present disclosure may include a housing 301, a tray 303, a first hole 333 in the tray, a second groove 334 in the first hole of the tray, a first groove 335 in the tray, a second hole 312 in the housing, and a rod 309. In the present embodiment, a detailed description of elements similar to the elements of the above-described embodiments will be omitted, and the remaining description will be directed primarily toward features of the second groove 334 and the first groove 335.

In this case, the rod 309 has features that are captured by the tray 303, and allow the captured rod 309 to then pull the tray 303 from the housing 301. To do so, the first hole 333 may be formed in the tray 303, and the second groove 334 may be formed on the inner wall of the first hole 333 along an insertion direction of the tray 303. The first groove 335 may extend from the second groove 334 along a circumferential direction at an inner end of the first hole 333. The rod 309 may have a protrusion 391 having a shape corresponding to the second groove 334.

In a state in which the tray 303 is mounted to the housing 301, while the protrusion 391 of the rod 309 is aligned with and moves along the second groove 334, the rod 309 can be inserted into the first hole 333. When the protrusion 391 has passed through the second groove 334 and the rod 309 is rotated, the protrusion 391 can be rotated within the first groove 335 up to 360 degrees. At this time, when the rod 309 and protrusion 391 are rotated to point where the protrusion 391 no longer aligns with the second groove 334 and the rod 309 is pulled in a direction in which the tray 303 is discharged from the housing 301, the protrusion 391 is caught by the first groove 335 so that the tray 303 can be discharged from the housing 301 though the tension applied by the rod 309 to the tray 303.

According to various embodiments, the second hole 312 in the housing may be configured to correspond to and align with the first hole 333. The diameter of the second hole 312 may be smaller than the diameter of the first hole 333. Accordingly, the second hole 312 can prevent further insertion of the rod 309, while allowing sound to pass to sensors in the device as described above. Further, the shape of the second hole 312 is different from the shape of the rod 309 and/or the protrusion 391 so that it is possible to prevent the rod 309 from being inserted further into the second hole 312. Further, a groove in which the rod 309 can be seated, may be configured in at least one of the first hole 333 and the second hole 312. Further, the first groove 335 formed in the first hole 333 or a third groove 314 formed along a circumferential direction in the second hole 312 can be selectively configured such that a part of the rod 309 seated between the first groove 335 and the third groove 314 can be easily rotated.

Figure 11:
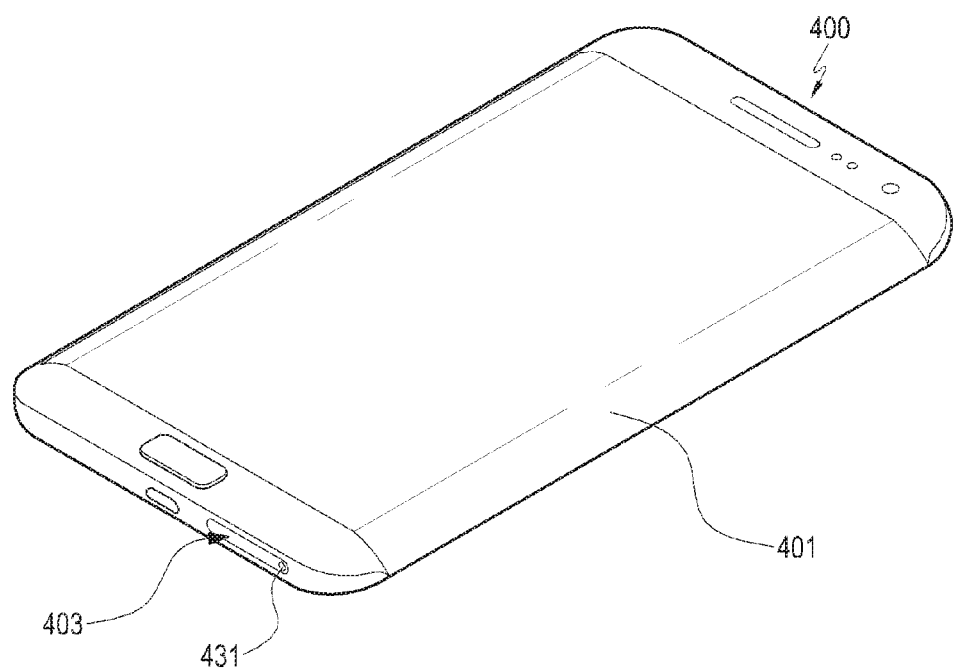
FIG. 11 is a perspective view illustrating a state in which a tray of an electronic device is separated from a housing according to various embodiments of the present disclosure.

FIG. 11 is a perspective view illustrating a state in which a tray of an electronic device is separated from a housing according to various embodiments of the present disclosure.

Referring to FIG. 11, an electronic device 400 according to various embodiments of the present disclosure may include a flexible display device 401.

One or more surfaces of the flexible display device 401 may have a curved surface. For example, both edge surfaces of the flexible display device 401 may be bent along the edge so that the flexible display device 401 can output an image such as a picture or an icon on both edge surfaces thereof, as well as on the front surface thereof.

Further, the electronic device 400 may include a tray 403 or a connector on the upper surface or the lower surface thereof. A hole 431 for discharging the tray 403 may be formed in the tray 403 substantially as described above. Environmental factors such as sounds, temperatures, atmospheric pressure and gasses can be introduced through the hole 431 from the outside but are blocked from reaching the inside of the device. Further, a connector may be connected to an external device such as a charging terminal or an earphone in substantially the same manner.

As described above, an electronic device according to various embodiments of the present disclosure may include a housing, a sensor disposed inside the housing, a tray for receiving a storage medium, the tray being detachably coupled to the inside of the housing, and a hole for providing a path for operating the tray to be discharged from the housing, wherein the hole can connect the sensor to the outside of the housing.

In an electronic device according to various embodiments of the present disclosure, a hole for providing a path for operating a tray to be discharged from a housing is connected to a sensor. Therefore, a separate hole connected to the sensor and the outside of the housing is not needed. As a result, the number of holes formed in the housing can be reduced. Further, the present disclosure can minimize the number of holes formed in the housing, thereby improving the function and aesthetic appearance of the electronic device. Further, the present disclosure can minimize the number of holes formed in the housing so as to minimize a dustproof/waterproof structure needed for the holes, thereby miniaturizing the electronic device.

Further, according to various embodiments of the present disclosure, in a state in which the tray is received in the interior of the housing, one surface of the tray can be located on the same plane as the outer surface of the housing.

Further, according to various embodiments, the sensor may include a sensor, such as a microphone sensor, a temperature sensor, an atmospheric sensor, or a gas sensor.

Further, according to various embodiments of the present disclosure, the housing may include an opening, and the tray may be detachably coupled to the inside of the housing through the opening.

Further, according to various embodiments of the present disclosure, the storage medium provided with the tray may include a SIM card, an authentication module or a memory card.

Further, the electronic device according to various embodiments of the present disclosure may further include a circuit board mounted to the housing, and a socket for receiving the tray, the socket being mounted on one surface of the circuit board.

Further, the electronic device according to various embodiments of the present disclosure may further include a sensor connection part mounted on the one surface of the circuit board alongside the socket and provided between the hole and the sensor.

Further, according to various embodiments of the present disclosure, the sensor may be mounted on the other surface of the circuit board, and the circuit board may include a sensor hole disposed between the sensor and the sensor connection part to connect the sensor and the sensor connection part to each other.

Further, the electronic device according to various embodiments of the present disclosure may further include a push bar for receiving a force from a rod inserted into the hole and transmitting the force to discharge the tray mounted to the socket to the outside.

Further, according to various embodiments of the present disclosure, the sensor connection part may include a connection hole for providing a path through which the rod is connected to the push bar.

Further, according to various embodiments of the present disclosure, the connection hole can be blocked by the push bar when not engaged with the rod.

Further, according to various embodiments of the present disclosure, the hole may include a first hole formed in the tray, and a second hole formed in the housing and corresponding to the first hole.

Further, according to various embodiments of the present disclosure, the electronic device may include a second groove formed on the inner wall of the first hole along the insertion direction of the tray, and a first groove extending from the second groove along a circumferential direction at an inner end of the first hole. A protrusion formed at one end of the rod can be inserted into the first hole along the second groove, and the rod and protrusion can be rotated in a direction in which the protrusion is positioned in the first groove.

Further, according to various embodiments of the present disclosure, in a state in which the tray is mounted to the housing, the rod and protrusion can be rotated after being inserted into the second groove and thus, the protrusion may be caught by the first groove so that the rod can pull the tray and thereby discharge the tray from the housing.

While the present disclosure has been shown and described with reference to various embodiments thereof, it will be understood by those skilled in the art that various changes in form and detail may be made therein without departing from the spirit and scope of the present disclosure as defined by the appended claims and their equivalents.

What is claimed is:

1. An electronic device, comprising:
a housing;
a sensor disposed inside the housing, wherein the sensor senses an environmental factor outside the housing;
a tray receiving a storage medium, the tray being detachably coupled to an inside of the housing;
an opening formed in at least one of the housing and the tray; and
a sensor connection part disposed inside the housing,
wherein the sensor connection part provides a first path for operating the tray to be discharged from the housing and a second path for providing the environmental factor flowing through the opening to the sensor.

2. The electronic device of claim 1, wherein, in a state in which the tray is coupled to the inside of the housing, one surface of the tray is located on the same plane as an outer surface of the housing.

3. The electronic device of claim 1, wherein the sensor comprises at least one of a microphone sensor, a temperature sensor, an atmospheric sensor, or a gas sensor.

4. The electronic device of claim 1,
wherein the housing comprises a third opening, and
wherein the tray is detachably coupled to the inside of the housing through the third opening.

5. The electronic device of claim 1, wherein the storage medium comprises at least one of a subscriber identification module (SIM) card, an authentication module or a memory card.

6. The electronic device of claim 1, further comprising:
a circuit board mounted in the housing; and
a socket receiving the tray, the socket being mounted on a first surface of the circuit board.

7. The electronic device of claim 6, further comprising the sensor connection part mounted on the first surface of the circuit board adjacent to the socket and disposed between the opening and the sensor.

8. The electronic device of claim 7,
wherein the sensor is mounted on a second surface of the circuit board, and
wherein the circuit board comprises a sensor hole disposed between the sensor and the sensor connection part to connect the sensor and the sensor connection part to each other.

9. The electronic device of claim 7, further comprising a push bar
receiving a force from a rod inserted into the opening, and
transmitting the force to discharge the tray mounted to the socket from the housing.

10. The electronic device of claim 9, further comprising a lever
receiving a force from the push bar, and
applying, in response to the force from the push bar, a force to the tray to discharge the tray mounted to the socket from the housing.

11. The electronic device of claim 9, wherein the sensor connection part comprises a connection hole configured to provide a path through which the rod is engaged with the push bar.

12. The electronic device of claim 11, wherein the connection hole is blocked by the push bar when not engaged by the rod.

13. The electronic device of claim 1, wherein the opening comprises:
a first opening portion formed in the tray; and
a second opening portion formed in the housing and corresponding to the first opening portion.

14. The electronic device of claim 13, further comprising:
a second groove formed on an inner wall of the first opening portion and extending along an insertion direction of the tray; and
a first groove formed on an inner wall of the tray and extending along a circumferential direction at an inner end of the first hole opening portion,
wherein the second groove slidably receives a protrusion at one end of a rod when inserted into the first opening portion, and
wherein the first groove captures the protrusion when the rod and protrusion are rotated after insertion into the first opening portion.

15. The electronic device of claim 14, wherein in a state in which the tray is coupled to the inside of the housing, while the protrusion is captured by the first groove, the tray is discharged from the housing in response to a retraction of the rod.

16. The electronic device of claim 1,
  wherein the opening comprises an inclined first opening portion formed in the tray, and
  wherein the inclined first opening portion is captured by a rod during insertion of the rod in an inclined direction into the inclined first opening portion and forces the rod in a non-inclined direction.

17. The electronic device of claim 16, wherein in a state in which the tray is coupled to the inside of the housing, while the rod is captured by the inclined first opening portion, the tray is discharged from the housing in response to a force of the rod in the non-inclined direction.

* * * * *